Jan. 20, 1970 W. L. FULTON Re. 26,777

FINE TUNING DRIVE WHICH CLUTCHES AUTOMATICALLY ON SLIGHT TURNING OF VERNIER KNOB AND DECLUTCHES AUTOMATICALLY ON EXCESSIVE TURNING

Original Filed June 27, 1961 5 Sheets-Sheet 1

INVENTOR.
WILLIAM LEONARD FULTON
BY
OSTROLENK, FABER, GERB & SOFFEN
ATTORNEYS

INVENTOR.
WILLIAM LEONARD FULTON
BY
OSTROLENK, FABER, GERB & SOFFEN
ATTORNEYS

INVENTOR.
WILLIAM LEONARD FULTON

BY

OSTROLENK, FABER, GERB & SOFFEN

ATTORNEYS

INVENTOR.
WILLIAM LEONARD FULTON
BY
OSTROLENK, FABER, GERB & SOFFEN
ATTORNEYS

INVENTOR
WILLIAM LEONARD FULTON
BY
OSTROLENK, FABER, GERB & SOFFEN
ATTORNEYS

United States Patent Office

Re. 26,777
Reissued Jan. 20, 1970

26,777

FINE TUNING DRIVE WHICH CLUTCHES AUTOMATICALLY ON SLIGHT TURNING OF VERNIER KNOB AND DECLUTCHES AUTOMATICALLY ON EXCESSIVE TURNING

William Leonard Fulton, Roselle, Ill., assignor to Standard Kollsman Industries, Inc., Melrose Park, Ill., a corporation of Illinois Original No. 3,248,674, dated Apr. 26, 1966, Ser. No. 403,690, Oct. 2, 1964, which is a continuation of application, Ser. No. 119,877, June 27, 1961. Application for reissue Apr. 22, 1968, Ser. No. 735,474
Int. Cl. H03j 5/02
U.S. Cl. 334—51 9 Claims

Matter enclosed in heavy brackets [ ] appears in the original patent but forms no part of this reissue specification; matter printed in italics indicates the additions made by reissue.

*ABSTRACT OF THE DISCLOSURE*

*A preset fine tuning arrangement, which includes a separately gear driven slug for tuning each of the channels, and the slug is automatically disengaged from the gear drive at the ends of its stroke.*

This invention relates to novel fine tuning mechanisms, particularly for television tuners, of effective, simplified and economical construction; and is a continuation of my U.S. Patent application Serial No. 119,877, filed June 27, 1961, for "Fine Tuning Mechanism," now abandoned.

The band-width of television channels is six megacycles. There are twelve VHF channels, which generally are tuned-in through individual or discrete steps. The common circuit sections of the tuner are thereby altered to tune to the desired channel frequency band. As the requisite oscillator frequencies for the signal heterodyning should be close to predetermined values, a common manual fine tuning element has generally been provided for this purpose. However, whenever such element is adjusted for one channel, it upsets the setting for the others.

Recently, relatively complex twelve-position camming devices have been introduced to avoid such resettings, utilizing individual presettable fine tuning cams for the channel selection positions of the tuner. Their utility has been particularly indicated in motorized remote tuning television receivers. Permitting individual channel fine tuning through external adjustment by a single knob, troublesome retuning of the other channels was avoided. However, the added weight, cost, space, and mechanical vulnerability of such devices have limited their general use in television receivers.

In accordance with the present invention, a single control pinion is operated through the external fine tuning knob, to selectively operate the oscillator coil slugs directly for all the television channels. The control pinion is rotatable in either direction, to effect fine longitudinal adjustments on any engaged slug, and thereby precisely tune the circuit for the selected channel. Upon manual release of the knob, internal resilient biasing of the invention mechanism directly disengages the control pinion. The oscillator slugs are thus retained in their individual settings for normal tuning-in operations by the tuner. Should any channel later require returning its presettable slug is directly reset simply by turning the fine tuning knob. Visual observation of this operation is available on the screen, as precise tuning presetting occurs with best picture reception.

The invention preset fine tuning mechanism is simple in construction, contains relatively few parts, and is rugged. Its compactness and economy make it practical for general television use. The preferred application is to directly control any of the oscillator coil slugs of the tuner, and thus eliminate the need for a common fine tuning impedance as heretofore employed. The oscillator slugs hereof are in the form of threaded metal members or screws. Each slug has a transverse head formed as a gear and engageable with the control pinion. The slug head gears are moved to be out of engagement with the pinion, at either end of their stroke.

It is accordingly a primary object of the present invention to provide novel fine-tuning mechanism, individually presettable in tuners with discretely tuned television channels.

Another object of this invention is to provide novel presettable fine tuning mechanism of simplified and rugged construction.

A further object of this invention is to provide novel presettable fine tuning mechanism of direct and precise operation; and directly disengaged when the external knob is released through internal biasing.

Still another object of this invention is to provide novel presettable fine tuning mechanism that inherently avoids damage to the oscillator slugs, or freezing of the mechanism at the end positions of the slugs.

These and other objects of this invention will become more apparent from the following description of an exemplary embodiment thereof, illustrated in the drawings, in which.

Figure 1:
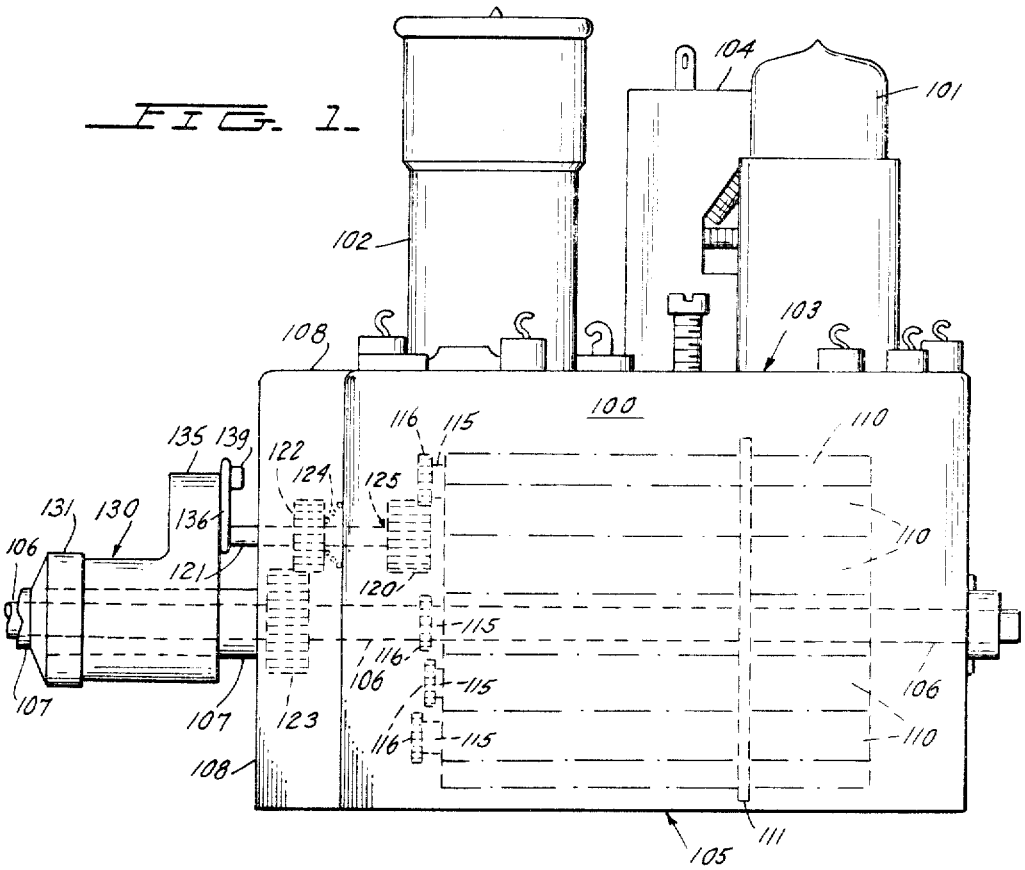
FIG. 1 is a side elevational view of a tuner, embodying a form of this invention.
Figure 2:
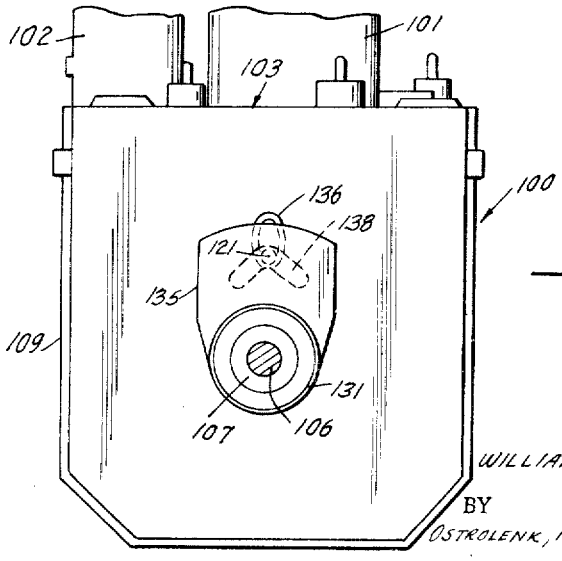
FIG. 2 is an end elevational view of the FIG. 1 tuner, showing the exterior preset mechanism portion in face view.
Figure 3:
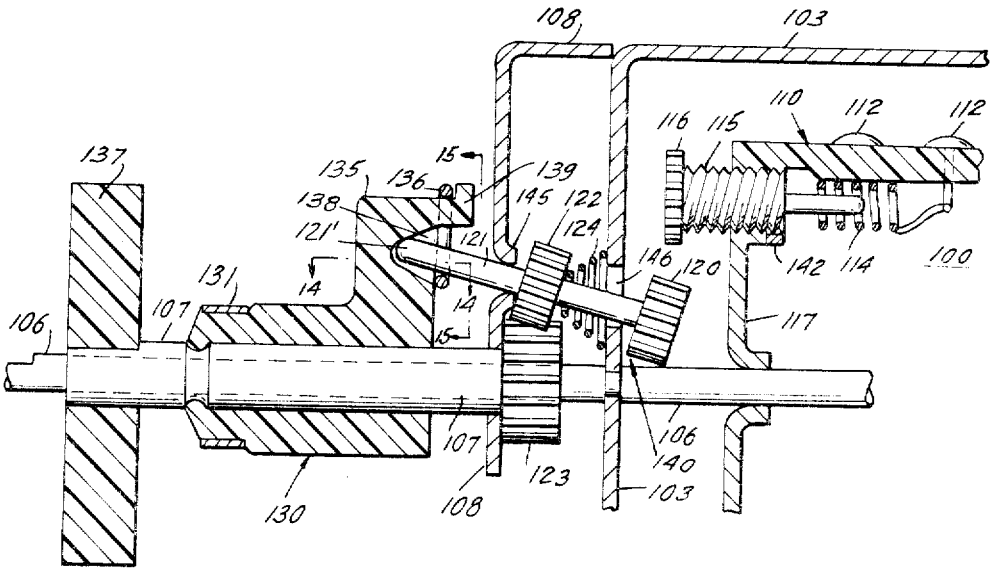
FIG. 3 is an enlarged cross-sectional view, longitudinally through the preset mechanism of FIG. 1 when in its neutral position.
Figure 4:
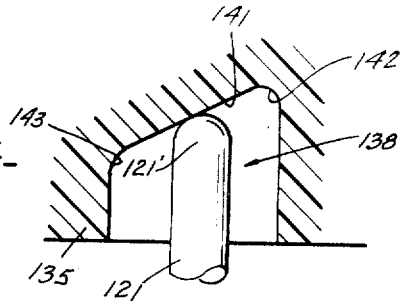
Figure 5:
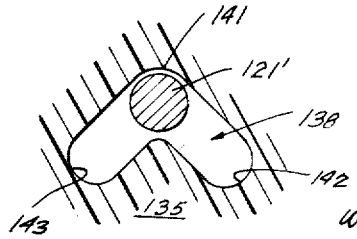

FIGS. 4 and 5 are respective cross-sectional views through the cam section of the FIG. 3 mechanism, taken along the lines 14—14 and 15—15 thereof.

Figure 6:
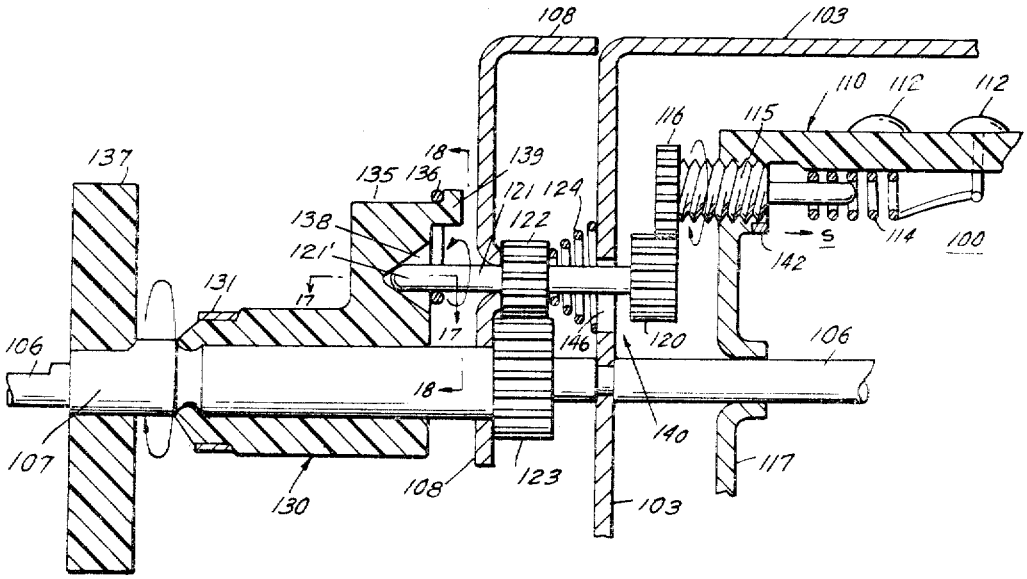

FIG. 6 is a cross-sectional view of the preset mechanism corresponding to FIG. 3 when in the clockwise knob fine tuning mode.

Figure 7:
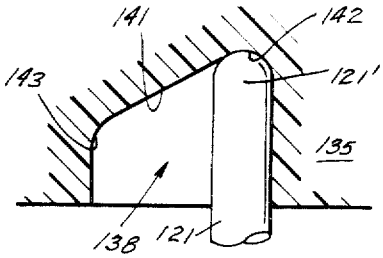
Figure 8:
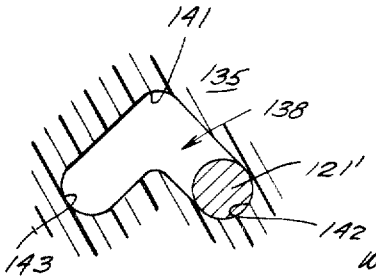

FIGS. 7 and 8 are respective enlarged cross-sectional and face views of the cam section of FIG. 6 taken along lines 17—17 and 18—18 thereof.

Figure 9:
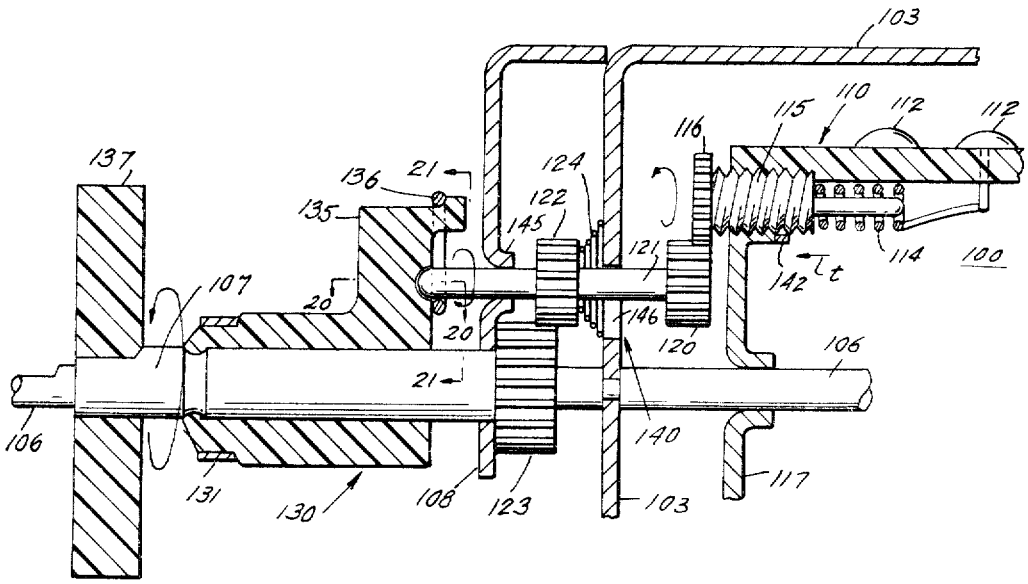

FIG. 9 is a cross-sectional view of the preset mechanism corresponding to FIG. 3, when in the counterclockwise knob fine tuning mode.

Figure 10:
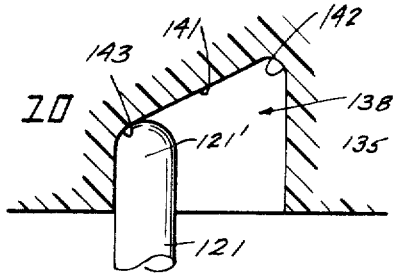
Figure 11:
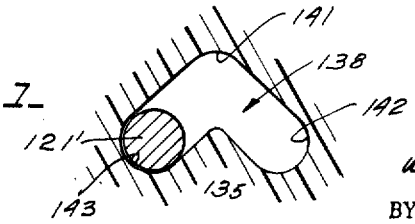

FIGS. 10 and 11 are respective enlarged cross-sectional and face views of the cam section of FIG. 9, taken along the lines 14—14 and 15—15 thereof.

Figure 12:
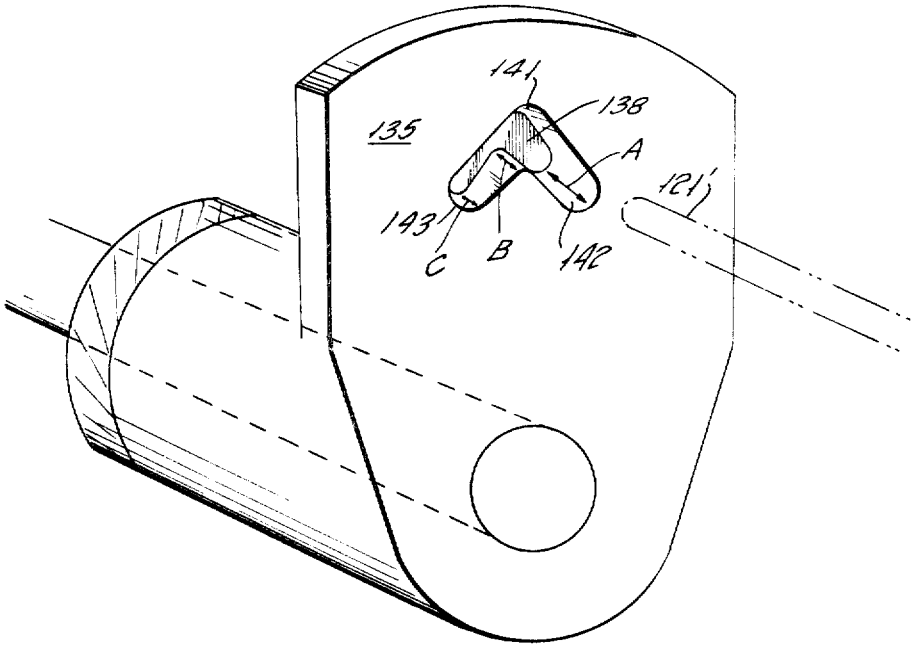

FIG. 12 is a perspective view of the actuating cam member.

The VHF television tuner, illustrated in FIGS. 1–11, embodies a preferred form of the present invention for selectively presetting the oscillator slugs by external manual operation of the fine tuning shaft. Tuner 100 utilizes typical RF circuitry including an RF amplifier tube 101 and oscillator-mixer tube at 102. A box-like metal chassis 103 encloses and shields a rotatable turret or drum 105 manually operated by selector control shaft 106. An antenna input network board 104 connects to the antenna lead-in. A separable front cover 108, and side-bottom cover 109, complete the overall shielding and protection of internal parts.

The drum 105 is composed of individual panels 110 longitudinally arranged across mounting discs, in a suitable conventional manner. A central disc 111 is advantageously used, as both a circuit shield and detent plate in the manner of U.S. Patent 2,496,183 which issued on January 31, 1950 and assigned to the same assignee.

Each panel 110 contains circuit elements, as coils, that are selectively connected into the fixed tuner circuitry through contacts 112, 112 (FIG. 3) on the panels, in the well known manner.

The oscillator coil (114) at the left end of each panel 110 (see FIG. 3) has a metallic slug 115 suitably threaded into the end of the panel (110) body, and is longitudinally displaceable in the coil 114 for presetting its circuit frequency. Each slug 115 contains a transverse head-gear 116 at its exterior end. The control pinion 120 is engaged with a positioned slug gear 116 through turning of fine tune hollow shaft 107 in either the C.W. or C.C.W. direction. The pinion shaft 121 contains driven gear 122 which is engaged with drive gear 123; schematically represented in dotted lines in FIG. 1.

A biasing spring 124 presses against gear 122 and moves the pinion-drive gear assembly 124, so that pinion 120 becomes disengaged from the slug gears 116 upon release of shaft 107, for the neutral mode. The slip-clutch-cam assembly 130 is pressed onto fine tune shaft 107 by a metal band 131. Its cam section 135 extends transversely outwardly and coacts with pinion shaft 121. Shaft 121 is held in coaction with cam 135 by a C spring 136, as will be set forth hereinafter. The coacting shaft end engages a hollowed-out cam 138 in cam section 135, indicated in dotted lines in FIG. 2.

FIG. 3 shows the preset fine tune mechanism 140 for the tuner 100 in its neutral mode, which occurs while the fine tune knob 137 on shaft 107 is released. The C spring 136 is hooked onto a projection 139 of cam body 135, and about the end 121' of control shaft 121 at cam 138. Spring 136 thereupon tilts shaft 121, with gear 122 pivoting on drive gear 123, thereby disengaging control pinion 120 from slug gears 116. The cam follower end 121' of control shaft 121 is forced against the apex 141 of the inverted V cam 138 surface of the clutch-cam member 130; see FIGS. 4 and 5. Such angular displacement of control pinion shaft 121 is a mechanically positive action in the control mechanism 140 hereof.

Further, the biasing spiral spring 124 presses against gear 122, and maintains shaft end 121' stably in cam 138 during the neutral mode. The slug 115 of the positioned panel 110 retains its longitudinal position last longitudinally preset with respect to its oscillator coil 114. A flat retaining spring 144 holds the slug 115 firmly in its preset positions in the dielectric panel 110. The oscillator end of panel 110 is suitably held in end mounting disc 117 of the drum 105. While individual removed panels (110) are used in tuner 100, it is to be understood that the preset mechanism 140 may be used with non-removable circuit elements and slugs (115).

The control mechanism gears 120, 122 and 123 are desirably made of tough and resilient plastic material, as is member 130. The control shaft 121 is arranged to freely pivot, with its left bearing 145 in cover plate 108 and aperture 146 in chassis wall 103 being adapted for this purpose. During the tilting and displacement (to the left) of the control shaft 121 to the "neutral" position illustrated in FIG. 3, spur gears 122 and 123 remain engaged. The control operation modes of mechanism 140 retains such gear engagement for the slug 115 presetting actions, as will now be described.

The resilient plastic material of gears 122, 123 permits smooth transition among the three operational modes, despite their angular and longitudinal displacements. In practice, the angular tilt of gear 122, to keep control pinion 120 clear of the head-gears (116) in the neutral mode, need not be more than the order of 15°. The tilt angle for shaft 121 is predetermined by the height of apex 141 of the inverted V cam 138, shown in cross-sectional FIGS. 4 and 5.

FIG. 6 illustrates the control mode for preset mechanism 140 when fine tune knob 137 is rotated in the C.W. direction. Slip-clutch 130 is thereupon turned in the C.W. direction, with its cam 135 abutting cam follower end 121' of shaft 121, as shown in face view FIG. 8. The cam surface 138 thus presses follower 121' to cam control shaft 121 into the horizontal position, and control pinion 120 also engages the positioned slug-gear 116. The clutch member 130 then slips with respect to shaft 137 while the latter is continued in rotation. For this mode, the cam 138 is shaped deepest at region 142. Control shaft 121 is thus displaced to the left by compressed spiral spring 124 to fully seat into cam region 142.

The C.W. rotation of fine tune knob 137 causes drive gear 123 to rotate driven gear 132 in the C.C.W. direction. The control shaft 121 and control pinion therefore turn in unison with gear 122. The positioned slug-gear 116 is thus rotated C.W. while knob 137 is turned C.W., as indicated by the arrows, in FIG. 6. Slug 115 is arranged to move longitudinally inwards of panel 110 when rotated C.W., as arrow s shows. Continued rotation of control pinion 120 results in spur gear 116 "riding off" its edge, being the end of its inwardly stroke.

The displacement of pinion 120 to the left, through cam region 142, insures a safe clearance of pinion 120 with respect to such stroke limit of gears 116. This prevents overdrive and damage to the gears 116 and the control mechanism 140. Upon release of knob 137, C. spring 136 automatically presses cam follower 121' into the cam apex 141, tilting conntrol shaft 121 and pinion 120 clear of the gear (116) paths and to "neutral."

FIG. 9 illustrates the C.C.W. control mode of preset mechanism 140. When knob 137 is turned C.C.W., clutch-cam assembly 130 is initially rotated from neutral, until the cam follower tip 121' engages the shallowest edge 143 of the inverted V cam 138. The control shaft 121 is positioned horizontally in the same manner as in the C.W. mode described. However, shaft 121 is displaced to the right by shallower cam surface 143 as shown in enlarged detail in FIGS. 10 and 11, and denoted in FIG. 9. The pinion 120 thereupon engages the positioned slug gear 116 and turns it in the C.C.W. direction, as indicated by the arrows.

The C.C.W. rotation of gears 116 motivates them in the outwardly direction of panels 110, as indicated by arrow t. Continued rotation of pinion 120 results in gear 116 riding off control pinion 120, over its left edge. This action safely disengages the slug gears (116) at the end of their "outwards" stroke. Release of knob 137 again returns the pinion to its tilt-off position of FIG. 3. Turning the fine tune knob C.W. shifts the pinion to the left of its FIG. 9 C.C.W. position, as seen in FIG. 6. Gears 116 at their outward stroke end are nevertheless engaged by the pinion of an inwards displacement upon C.W. rotation of knob 137. Similarly, gears at their inward stroke end are reengaged when the C.C.W. control mode is used.

FIG. 12 is a perspective view of cam means 28, with forward projection 139 purposely deleted so as not to obscure the internal shape of the V-shaped cam surface. The V-shaped opening into which cam follower end 121' projects is of a variable depth, consistent with the cross-sectional views, as for example shown in FIGS. 4 and 5. Thus, in the normal rest position (of FIGS. 3–5) wherein cam follower end 121' is located at the apex of the V-shaped cam slot, it will project into said cam slot by the distance indicated as arrow B.

When it is desired to move slug 119 inward, the fine tuning controls are as shown in FIGS. 6–8, wherein cam follower end 121' will now be located in the deepest region 142 of the cam slot, with the depth thereof being indicated by arrow A. Continued rotation of the control pinion 120 moves slug 115 inward, with the length of gear members 116, 120 being interrelated to the depth of the cam slot, such that spur gear 116 will ride off the edge of pinion 120 at the end of its inward stroke.

Although the present invention has been illustrated with exemplary embodiments, it is to be understood that variations and modifications thereof may be made by those skilled in the art, that fall within the broader spirit and scope of the invention, as set forth in the following claims.

The embodiments of the invention in which an exclusive privilege or property is claimed are defined as follows.

1. A television tuner having a plurality of channel selection positions individually selectable through rotation of the channel selector shaft, *a* coil arranged at each of said channel positions for tuning of the associated tuner channel circuitry, a slug for each of said coils arranged about the axis of said selector shaft and mounted for adjustable inductance coaction with its associated coil, said slugs being individually longitudinally displaceable, gear means affixed to each of said lugs at the exterior end thereof, a preset tuning shaft for individually adjusting the tuning position of said slugs with their respective coils, drive gear means engageable with the respective slug gear means of the coil positioned for the selected channel, said drive *gear* means being disposed and supported radially from said preset tuning shaft, and mechanism coupled to said preset tuning shaft for rotating said drive gear means and engaging it with the positioned slug gear means in either rotational direction and thereby controllably displac[e]*ing* the slug of the positioned coil in either longitudinal direction, said mechanism including biasing means for normally holding said drive gear means disengaged for said slug gear means while said *preset* tuning shaft is released, whereby the tuner channel circuits are held tuned corresponding to the slug positions preset through said preset tuning shaft and mechanism and channel selection by said selector shaft is unhindered, in which said mechanism includes a clutch coupled to said *preset* tuning shaft and a cam means motivated by said clutch [and containing a cam surface], [a] cam follower *means* coupled to said drive gear means, said cam [surface] *means* coactable with said cam follower *means* to displace the cam follower *means* and bring said drive gear means into driving engagement with said slug gear means against *said* [the] biasing means upon rotation of said *preset* tuning shaft in either direction, said biasing means directly moving sad cam follower *means* to a position [in said cam] effecting said disengaged relationship *between said drive gear means and slug gear means* upon release of said *preset* tuning shaft, said mechanism further including resilient means for axially displacing said cam follower into coaction with said cam [surface] *means,* said cam [surface] *means* being proportioned to axially position said drive gear means to permit the slug gear means to *dis*engage therefrom when its associated slug is at the end of its stroke in either direction [.] *and to reestablish engagement with said disengaged slug gear means when operated in the opposite direction.*

2. A television tuner having a plurality of channel selection positions individually selectable through rotation of the channel selector shaft, an oscillator coil arranged at each of said channel positions for tuning of the associated tuner channel circuitry, a slug for each of said coils arranged concentrically about the axis of said selector shaft and mounted for inductive coaction with its associated coil, said slugs being individually longitudinally displaceable within said coil along a path parallel to said selector shaft axis, a gear affixed to each of said slugs extending transversely thereof at the exterior end thereof perpendicularly to said axis, a preset tuning shaft concentric with said selector shaft for individually adjusting the fine tuning position of said slugs with their respective coils, a control pinion engageable with the respective slug gear of the coil positioned for the selected channel, said control pinion being disposed radially from said preset tuning shaft, and mechanism operated by said preset tuning shaft for rotating said control pinion and engaging it with the positioned slug gear in either rotational direction and thereby controllably displac[e]*ing* the slug of the positioned coil in either longitudinal direction, said mechanism including biasing means for normally holding said control pinion from said slug gear while said *preset* tuning shaft is released, whereby the tuner channel circuits are held tuned corresponding to the slug positions preset through said tuning shaft and mechanism and channel selection by said selector shaft is unhindered thereby, in which said mechanism includes a slip clutch coupled to said tuning shaft and a cam motivated by said slip clutch and containing a cavity cam surface, a cam follower coactable with said cam surface and coupled with said control pinion, said cam surface being proportioned to displace [the] *said* cam follower and bring said control pinion into driving engagement with said slug gear against the biasing means [hold] upon rotation of said *preset* tuning shaft in either direction, said biasing means directly moving said cam follower to a position in said cam effecting said disengaged relationship upon release of said tuning shaft, and resilient means for axially displacing said cam follower into coaction with said cam surface, said cam surface being proportioned to axially position said control pinion to permit the slug gear to disengage therefrom when its associated slug is at the end of its stroke in either direction and to reestablish engagement with such disengaged slug gear when operated in the opposite direction.

*3. A television tuner having a plurality of channel selection positions individually selectable through rotation of the channel selector shaft, a coil arranged at each of said channel positions for tuning of the associated tuner channel circuitry, a slug for each of said coils arranged about the axis of said selector shaft and mounted for adjustable inductance coaction with its associated coil, means for threadably retaining said slugs for individual longitudinal displacement within their respective coils and for maintaining the preset slug position, gear means affixed to each of said slugs at the exterior end thereof, a preset tuning shaft for individually adjusting the tuning position of said slugs within their respective coils, drive gear means engageable with the respective slug gear means of the coil positioned for the selected channel, said drive gear means being disposed and supported radially from said preset tuning shaft, and mechanism coupled to said preset tuning shaft for rotating said drive gear means and engaging it with the positioned slug gear means in either rotational direction and thereby controllably displacing the slug of the positioned coil along said threadably retaining means in either longitudinal direction, said mechanism including biasing means for normally holding said drive gear means disengaged from said slug gear means while said preset tuning shaft is released, whereby the tuner channel circuits are held tuned corresponding to the longitudinal slug positions, preset through said preset tuning shaft and mechanism and channel selection by said selector shaft is unhindered, said threadably retaining means providing longitudinal translation of said slugs within their respective coils to define a stroke length between predetermined first and second end extremes, and means for longitudinally shifting said drive gear means such that said slug gear means is disengaged therefrom when its associated slug is at said end extremes of its stroke and the rotational input of said preset tuning shaft is continued in the same rotational direction, and for reestablishing engagement with said disengaged slug gear means when said preset tuning shaft is rotated in the opposite direction.*

*4. A television tuner, as set forth in claim 3:*

*said means for longitiudinally shifting said drive gear means including means responsive to the direction of rotation of said preset tuning shaft for positioning said drive gear means at a first longitudinal position corresponding to rotation of said preset tuning shaft in a first direction, and at a second longitudinal position corresponding ot rotation of said preset tuning shaft in a second direction, said first rotational direction rotating said slug gear means*

*through said mechanism and drive gear in a direction to provide inward longitudinal movement of its associated slug along the threadably retaining means of its coil, said second rotational direction rotating said slug gear means in the opposite direction to provide outward longitudinal movement of its associated slug along the threadably retaining means, said first longitudinal position of said drive gear means being longitudinally outward with respect to said second longitudinal position.*

*5. A television tuner as set forth in claim 4:*

*said drive gear means including a pinion of a predetermined longitudinal extent between an inward first end and an outward second end, said slug gear means longitudinally translating along the length of said pinion during rotational driving engagement thereof, said first end extreme of said slug within its coil being the inward end of the stroke and said second end extreme being the outward end of the stroke, the longitudinal extent and longitudinal shifting movement of said pinion being operatively related to the length of slug stroke, such that said slug gear means rides off said first end of the pinion at said first end of its inward stroke, while said pinion is positioned at said second longitudinally outward position, and said slug gear means rides off said second end of the pinion at said second end of its outward stroke while said pinion is positioned at said first longitudinally inward position, the longitudinal shifting of said pinion between said first and second longitudinal positions being sufficient to reestablish engagement with said pinion and said slug gear means when said preset tuning shaft is operated in the opposite direction.*

*6. A television tuner, as set forth in claim 3, further including camming means, said camming means including cam means motivated by rotation of said preset tuning shaft and cooperative cam follower means operatively connected to said drive gear means, said camming means operating against said biasing means for radially bringing said drive gear means into engagement with the slug gear means of the selected channel, and longitudinally shifting said drive gear means when the rotational input to said preset tuning shaft is reversed.*

*7. A television tuner as set forth in claim 4, further including camming means, said camming means including cam means motivated by rotation of said preset tuning shaft and cooperating cam follower means operatively connected to said drive gear means, said camming means operating against said biasing means for radially bringing said drive gear means into engagement with the slug gear means of the selected channel, and longitudinally shifting said drive gear means between said first and second longitudinal positions when the rotational input to said preset tuning shaft is reversed.*

*8. A television tuner as set forth in claim 6, further including a slip clutch means coupling said cam means to said preset tuning shaft.*

*9. A television tuner having a plurality of channel selection positions individually selectable through rotation of the channel selector shaft, a coil arranged at each of said channel positions for tuning of the associated tuner channel circuitry, a slug for each of said coils arranged about the axis of said selector shaft and mounted for axially adjustable inductance coaction with its associated coil, means for threadably retaining said slugs for individual longitudinal displacement within their respective coils and for maintaining the preset slug position, slug gear means affixed to each of said slugs at the outer end thereof, preset tuning mechanism selectively engageable with the particular tuning slug at the tuning position for individually adjusting the axial position of such slug between predetermined first and second end extremes, said preset tuning mechanism including a preset tuning shaft mounted for rotation about an axis parallel to the axes of said slug, drive gear means mounted off-axis from said preset tuning shaft and shiftable between an engaged position for transmitting rotary motion between said preset tuning shaft and the slug gear means for the slug at said tuning position and a disengaged position, and means responsive during rotation of said tuning shaft in one direction for shifting said drive gear means to an axially forward engaged position and responsive during rotation of said tuning shaft in an opposite direction for shifting said drive gear means to an axially rearward engaged position such that the slug gear means at said tuning position becomes disengaged when the corresponding slug reaches the end extreme corresponding to continued rotation of the tuning shaft in one direction and becomes reengaged when the tuning shaft is rotated in an opposite direction.*

References Cited

The following references, cited by the Examiner, are of record in the patented file of this patent or the original patent.

UNITED STATES PATENTS

| | | | |
|---|---|---|---|
| 3,144,626 | 8/1964 | Schwartz | 334—51 |
| 3,058,075 | 10/1962 | Polley | 334—51 |
| 3,148,345 | 9/1964 | Moran | 334—51 |

ELI LIEBERMAN, Primary Examiner

U.S. Cl. X.R.

74—10.8